United States Patent
Karlgaard

(10) Patent No.: US 12,385,956 B2
(45) Date of Patent: Aug. 12, 2025

(54) MULTI-PORT METER

(71) Applicant: Landis+Gyr Technology, Inc., Alpharetta, GA (US)

(72) Inventor: Matt Karlgaard, Brainerd, MN (US)

(73) Assignee: LANDIS+GYR TECHNOLOGY, INC., Alpharetta, GA (US)

(*) Notice: Subject to any disclaimer, the term of this patent is extended or adjusted under 35 U.S.C. 154(b) by 142 days.

(21) Appl. No.: 18/299,869

(22) Filed: Apr. 13, 2023

(65) Prior Publication Data

US 2024/0345143 A1 Oct. 17, 2024

(51) Int. Cl.
G01R 21/07 (2006.01)
G01R 21/00 (2006.01)
G01R 22/06 (2006.01)

(52) U.S. Cl.
CPC ........... G01R 21/07 (2013.01); G01R 21/007 (2013.01); *G01R 22/06* (2013.01)

(58) Field of Classification Search
CPC ....... G01R 21/07; G01R 21/007; G01R 22/06
USPC ...................................... 324/140 R
See application file for complete search history.

(56) References Cited

U.S. PATENT DOCUMENTS

| | | | | |
|---|---|---|---|---|
| 2017/0212160 A1* | 7/2017 | Fulton | ........................ | H02H 3/08 |
| 2020/0379021 A1* | 12/2020 | Karlgaard | .............. | H01R 33/94 |
| 2021/0111565 A1 | 4/2021 | Karlgaard et al. | | |
| 2021/0148948 A1* | 5/2021 | Karlgaard | .............. | G01R 11/04 |
| 2022/0065904 A1* | 3/2022 | Karlgaard | ............ | G01R 22/065 |
| 2022/0244076 A1 | 8/2022 | Karlgaard et al. | | |
| 2024/0012037 A1* | 1/2024 | Tanwani | ............... | G01R 22/065 |
| 2024/0345144 A1* | 10/2024 | Karlgaard | ............ | G01R 22/061 |

FOREIGN PATENT DOCUMENTS

| AU | 2020283031 A1 | 1/2022 |
|---|---|---|
| AU | 2020363385 A1 | 5/2022 |
| WO | 2022174119 A1 | 8/2022 |

OTHER PUBLICATIONS

International Search Report and Written Opinion for International application No. PCT/US2024/024197, dated Aug. 26, 2024, 16 pages.

* cited by examiner

*Primary Examiner* — Raul J Rios Russo
(74) *Attorney, Agent, or Firm* — Tarolli, Sundheim, Covell & Tummino LLP

(57) ABSTRACT

An electric meter is disclosed. The electric meter comprises a first set of conductive paths configured to connect a first phase of an electric distribution power source, a first phase of a first distributed energy resource device, a first phase of a second distributed energy resource device, and a first phase of a load. The electric meter comprises a second set of conductive paths configured to connect a second phase of the electric distribution power source, a second phase of the first distributed energy resource device, a second phase of the second distributed energy resource device, and a second phase of the load. Also disclosed is a method of use of the electric meter and an electric meter system.

14 Claims, 3 Drawing Sheets

MULTI-PORT METER

FIELD OF INVENTION

The present disclosure is in the field electric meters, and relates in particular to an electric meter for use with multiple distributed energy resources. The disclosure also relates to an associated electric meter system and methods of use of the electric meter.

BACKGROUND TO INVENTION

Distributed Energy Resources may be implemented as relatively small-scale electricity supply or demand resources that may be coupled to the electric grid. Examples of Distributed Energy Resource (DER) devices may include solar panels, generators, turbines, batter energy storage systems, electric vehicle batteries, and the like.

A general use of such DER devices in increasing, in particular by consumers at domestic premises, e.g. residential consumers, due to an increasing adoption of electric vehicles comprising battery storage systems and/or implementation of local energy generation and storage systems such as solar panels with associated battery storage systems.

Connection of DER devices to the electric grid may be complex, expensive, time-consuming and in some cases unsafe. An increase in the range of use cases of DER devices, and in particular to the use of local electricity generation and consumption, has led to increasingly varied use cases and demands on electric meter installations. For example, it may be required to couple multiple DER devices to an electric meter, wherein a flow of energy to be metered may be both to and from such DER devices.

As such, a high degree of flexibility and control in electric meter installation may be required. However, a general lack of standardization of electric meters suitable for use with multiple DER devices may lead to sub-optimal electric meter installation, and may limit a degree of control, metering and possible disaggregation of DER device usage.

It is therefore desirable to provide an electric meter suitable for use with a plurality of DER devices.

It is therefore an aim of at least one embodiment of at least one aspect of the present disclosure to obviate or at least mitigate at least one of the above identified shortcomings of the prior art.

SUMMARY OF INVENTION

The present disclosure is in the field of electric meters, and relates in particular to an electric meter for use with distributed energy resources. The disclosure also relates to an associated electric meter system and methods of use of the electric meter. According to a first aspect of the disclosure, there is provided an electric meter comprising: a first set of conductive paths configured to connect a first phase of an electric distribution power source, a first phase of a first distributed energy resource device, a first phase of a second distributed energy resource device, and a first phase of a load, and a second set of conductive paths configured to connect a second phase of the electric distribution power source, a second phase of the first distributed energy resource device, a second phase of the second distributed energy resource device, and a second phase of the load.

The electric meter may comprise a plurality of blades. The plurality of blades may be arranged to provide a line port comprising connectivity to the first and second phases of the electric distribution power source.

The plurality of blades may be arranged to provide a load port comprising connectivity to the first and second phases of the load.

The plurality of blades may be arranged to provide a first distributed energy resource port comprising connectivity to the first and second phases of the first distributed energy resource device.

The plurality of blades may be arranged to provide a second distributed energy resource port comprising connectivity to the first and second phases of the second distributed energy resource device.

The plurality of blades may be arranged to provide a neutral connection path.

Blades of the first distributed energy resource port may be disposed between blades of the load port.

Blades of the second distributed energy resource port may be disposed between blades of the line port.

The blade of the optional neutral connection path may be disposed substantially between the line port and the load port.

It will be appreciated that the above configuration of blades is provided for purposes of example, and other configurations of blades fall within the scope of the disclosure. For example, a position of the eight blades (or nine if the optional neutral blade is implemented) relative to one another may be different from that described above.

The electric meter may comprise a first controllable electrical disconnect switch configured to selectively connect the first distributed energy resource device to the electric distribution power source, the load and/or the second distributed energy resource device.

The electric meter may comprise a second controllable electrical disconnect switch configured to selectively connect the second distributed energy resource device to the electric distribution power source, the load and/or the first distributed energy resource device.

The electric meter may comprise a third controllable electrical disconnect switch configured to selectively connect the electric distribution power source to the first distributed energy resource device, the load and/or the second distributed energy resource device.

The electric meter may comprise a fourth controllable electrical disconnect switch configured to selectively connect the load to the electric distribution power source, the first distributed energy resource device and/or the second distributed energy resource device.

The electric meter may comprise first electrical metrology components configured to meter one or more voltages and/or currents of the first set of conductive paths.

The electric meter may comprise second electrical metrology components configured to meter one or more voltages and/or currents of the second set of conductive paths.

The electric meter may comprising a housing configured to house at least the first and second electrical metrology components. The housing may comprise a substantially cylindrical shape.

The first electrical metrology components may comprise a first set of current transducers configured to monitor a current on at least one of: the first phase of the electric distribution power source; the first phase of the first distributed energy resource device; the first phase of the second distributed energy resource device; the first phase of the load.

The first electrical metrology components may comprise a first set of voltage transducers configured to monitor a voltage on at least one of: the first phase of the electric distribution power source; the first phase of the first distributed energy resource device; the first phase of the second distributed energy resource device; the first phase of the load.

The second electrical metrology components may comprise a second set of current transducers configured to monitor a current on at least one of: the second phase of the electric distribution power source; the second phase of the first distributed energy resource device; the second phase of the second distributed energy resource device; the second phase of the load.

The second electrical metrology components may comprise a second set of voltage transducers configured to monitor a voltage on at least one of: the second phase of the electric distribution power source; the second phase of the first distributed energy resource device; the second phase of the second distributed energy resource device; the second phase of the load.

The electric meter may comprise a processing and acquisition circuit configured to acquire and process measurements from the first and second electrical metrology components.

The electric meter may comprise a communications module. The communications module may be configured to enable communication with other meters and/or with a utility.

According to a second aspect of the disclosure, there is provided an electric meter system, comprising: an electric meter according to the first aspect; and an electric meter socket comprising a plurality of receptacles configured to receive the electric meter. The electric meter socket may be configured to couple: the first set of conductive paths to the first phase of the electric distribution power source, the first phase of the first distributed energy resource device, the first phase of the second distributed energy resource device, and the first phase of a load; and the second set of conductive paths to the second phase of the electric distribution power source, the second phase of the first distributed energy resource device, the second phase of the second distributed energy resource device, and the second phase of a load.

The socket may comprise at least one neutral connection path configured to form a neutral conductive path between the electric meter and neutral conductors of the electric distribution power source, the first distributed energy resource device, the second distributed energy resource device, and the load.

According to a third aspect of the disclosure, there is provided a method of use of the electric meter according to the first aspect. The method may comprise coupling the meter, via a corresponding meter socket, to an electric distribution power source, a first distributed energy resource device, a second distributed energy resource device, and a load.

The method may comprise a step of configuring a first controllable electrical disconnect switch of the meter to connect the first distributed energy resource device to the load and/or the second distributed energy resource device.

The method may comprise a step of configuring a second controllable electrical connect switch of the meter to connect the second distributed energy resource device to the load and/or the first distributed energy resource device.

The method may comprise a step of configuring a third controllable electrical disconnect switch of the meter configured to disconnect the electric distribution power source from the first distributed energy resource device, the load and/or the second distributed energy resource device.

The method may comprise calculating a power for a port of the electric meter by: multiplying a current of the first phase measured at the port by a measured line voltage for the first phase to determine a power of the first phase at the port; multiplying a current of the second phase measured at the port by a measured line voltage for the second phase to determine a power of the second phase at the port; and adding the power of the first phase to the power of the second phase.

The above summary is intended to be merely exemplary and non-limiting. The disclosure includes one or more corresponding aspects, embodiments or features in isolation or in various combinations whether or not specifically stated (including claimed) in that combination or in isolation. It should be understood that features defined above in accordance with any aspect of the present disclosure or below relating to any specific embodiment of the disclosure may be utilized, either alone or in combination with any other defined feature, in any other aspect or embodiment or to form a further aspect or embodiment of the disclosure.

BRIEF DESCRIPTION OF DRAWINGS

These and other aspects of the present disclosure will now be described, by way of example only, with reference to the accompanying drawings, wherein.

DETAILED DESCRIPTION OF DRAWINGS

Currently there is no standard system for connecting multiple DER devices to an electric meter, in a manner that provides suitable control of the individual DER devices and disaggregation capabilities.

An electric meter and associated electric meter system is described herein that provides a means to meter electricity originating from both a plurality of DER devices and the electric grid. For purposes of non-limiting example, such DER devices may include a residential photovoltaic installation with or without associated local energy storage, a residential wind turbine installation with or without associated local energy storage, an electric vehicle battery, or the like.

Figure 1:
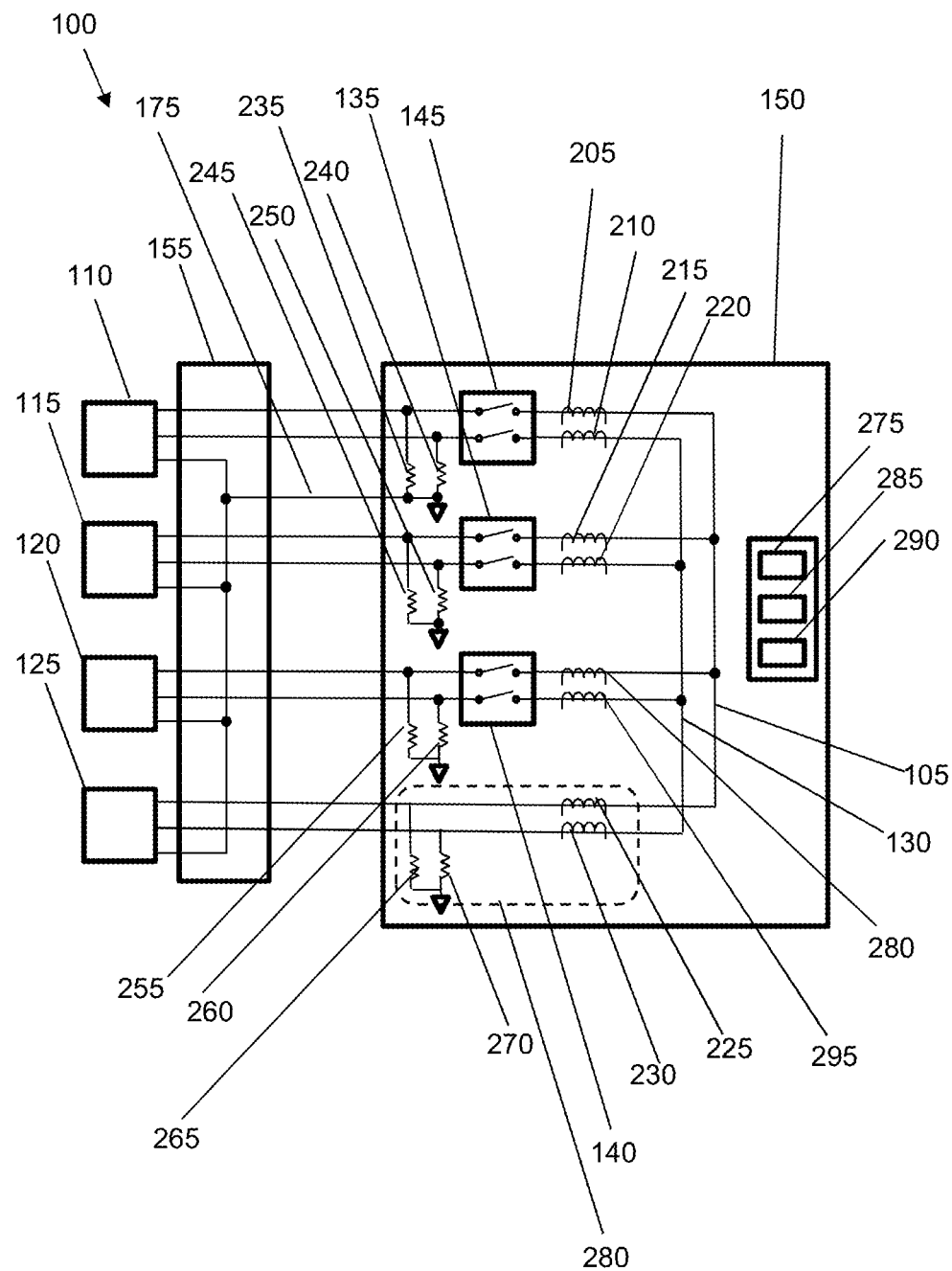
FIG. 1 depicts a representation of an electric meter system according to an embodiment of the disclosure.

FIG. 1 depicts a representation of an electric meter system 100 according to an embodiment of the disclosure.

The electric meter system 100 comprises an electric meter 150. The electric meter system 100 comprises an electric meter socket 155 comprising a plurality of receptacles configured to receive blades of the electric meter 150, as described in more detail with reference to FIG. 2.

Also depicted is an electric distribution power source 110, e.g. the grid, a first distributed energy resource device 115, a second distributed energy resource device 120, and a load 125, all coupled to the electric meter 150 via the meter socket 155. In some examples, one or more circuit breakers, miniature circuit breakers (MCBs), fuses, residual current devices (RCDs) and/or controllable disconnect switches may be implemented between the socket and one or more of the first distributed energy resource device 115, the second distributed energy resource device 120 and/or the load.

The electric meter 150 comprises a first set of conductive paths 105 configured to connect a first phase of the electric distribution power source 110, a first phase of the first distributed energy resource device 115, a first phase of the second distributed energy resource device 120, and a first phase of the load 125.

The electric meter 150 also comprises a second set of conductive paths 130 configured to connect a second phase of the electric distribution power source 110, a second phase of the first distributed energy resource device 115, a second phase of the second distributed energy resource device, and a second phase of the load.

In the disclosed example, the electric meter 150 comprises a plurality of controllable electrical disconnect switches 135, 140, 145.

In the disclosed example, the electric meter optionally 150 comprises a first controllable electrical disconnect switch 135 configured to selectively connect the first distributed energy resource device 115 to the electric distribution power source 110, the load 125 and the second distributed energy resource device 120.

In the disclosed example, the electric meter optionally 150 comprises a second controllable electrical disconnect switch 140 configured to selectively connect the second distributed energy resource device 120 to the electric distribution power source 110, the load 125 and the first distributed energy resource device 115.

In the disclosed example, the electric meter optionally 150 comprises a third controllable electrical disconnect switch 145 configured to selectively connect the electric distribution power source 110 to the first distributed energy resource device 115, the load 125 and the second distributed energy resource device 120.

In some example embodiments, the electric meter may optionally 150 comprise a fourth controllable electrical disconnect switch (not shown) configured to selectively connect the load 125 to the first distributed energy resource device 115, the second distributed energy resource device 120, and the electric distribution power source 110.

It will be appreciated that all of the first to fourth controllable electrical disconnect switches are optional, and all embodiments comprising one or more of the controllable electrical disconnect switches fall within the scope of the disclosure.

The example electric meter 150 comprises a plurality of electrical metrology components configured to meter one or more voltages and/or currents of the first and second sets of conductive paths 150, 130. Voltages and currents, such as voltages and currents provided by any of the electric distribution power source 110, the first distributed energy resource device 115 or the second distributed energy resource device 120, may be measured, or metered, by the plurality of electrical metrology components. The electrical metrology components may measure electrical characteristics of voltage and current waveforms, respectively. A power delivered to/consumed at a port of the electric meter 150 may be calculated based on the voltage and current measurements, as described in more detail below.

A first current transducer 205 is configured to monitor a current on the first phase of the electric distribution power source 110.

A second current transducer 210 is configured to monitor a current on the second phase of the electric distribution power source 110.

A third current transducer 215 is configured to monitor a current on the first phase of the first distributed energy resource device 115.

A fourth current transducer 220 is configured to monitor a current on the second phase of the first distributed energy resource device 115.

A fifth current transducer 280 is configured to monitor a current on the first phase of the second distributed energy resource device 120.

A sixth current transducer 295 is configured to monitor a current on the second phase of the second distributed energy resource device 120.

In some optional embodiments, a seventh current transducer 225 may also be included and is configured to monitor a current on the first phase of the load 125.

In some optional embodiments, an eighth current transducer 230 may also be included and is configured to monitor a current on the second phase of the load 125.

Although the seventh current transducer 225 and eighth current transducer 230, e.g. those associated with the load port, are described as optional, it will be appreciated that in embodiments it may be necessary to measure current on only three of the four ports, e.g. three out of the load port, line port, first distributed energy resource port and the second distributed energy resource port. As such, in some embodiments the current transducers may be removed from a different port than the load port.

That is, in some embodiments instead of the seventh and eighth current transducers 225, 230 being removed, either the first and second current transducers 205, 210, or the third and fourth current transducers 215, 220, or the fifth and sixth current transducers 280, 295 may be removed.

A first voltage transducer 235 is configured to monitor a voltage on the first phase of the electric distribution power source 110.

A second voltage transducer 240 is configured to monitor a voltage on the second phase of the electric distribution power source 110.

A third voltage transducer 245 is configured to monitor a voltage on the first phase of the first distributed energy resource device 115.

A fourth voltage transducer 250 is configured to monitor a voltage rent on the second phase of the first distributed energy resource device 115.

A fifth voltage transducer 255 is configured to monitor a voltage on the first phase of the second distributed energy resource device 120.

A sixth voltage transducer 260 is configured to monitor a voltage on the second phase of the second distributed energy resource device 120.

In some optional embodiments, a seventh voltage transducer 265 is also included, and may be configured to monitor a voltage on the first phase of the load 125.

In some optional embodiments, an eighth voltage transducer 270 may also be included, and may be configured to monitor a voltage on the second phase of the load 125.

Although a total of eight voltage transducers and eight current transducers are depicted in the example embodiment of FIG. 1, it will be appreciated that in other embodiments, fewer than eight current and/or voltage transducers may be implemented. For example, the embodiment of FIG. 2 comprises six current transducers and six voltage transducers. That is, in example embodiments the optional transducers 180 may not be implemented.

The electric meter 150 may comprise a processing circuit 275 and an acquisition circuit 285 configured to acquire and process measurements from the above-described electrical metrology components. For example, said acquisition circuit 285 may comprise one or more analog to digital converters.

Said processing circuit 275 may comprise one or more microprocessors, microcontrollers, or the like.

The processing circuit 275 may be configured to control the first controllable electrical disconnect switch 135, the second controllable electrical disconnect switch 140, and/or the third controllable electrical disconnect switch 145.

In some embodiments, the electric meter 150 may comprise a communications module 290. The communications module 190 may be configured to enable communication with other meters and/or with a utility. The communications module 190 may be at least partly integrated into or coupled to the processing circuit 275.

The communications module 190 may be configured to communicate by at least one of: wirelessly; via a cellular network; via power line communications; via a mesh network; using a protocol conforming to a Wireless Smart Utility Network (Wi-SUN) protocol, such as a protocol conforming to an IEEE 802.15.4g standard; or the like. The communications module 190 may be configured to receive communications that include instructions for controlling the first controllable electrical disconnect switch 135, the second controllable electrical disconnect switch 140, and/or the third controllable electrical disconnect switch 145.

The communications module 190 may transmit data related to the operation of the electric meter 150, such as data corresponding to measurements performed by the above-described electrical metrology components.

In a first example method, which may be a primary method, the processing circuit 275 may be configured to calculate a power for a port of the electric meter 150 by: multiplying a current at a port by a voltage measured at the grid port (per phase). Optionally, in some embodiments, irrespective of which voltage is used for calculating the power, all eight voltages may be measured, e.g. each phase on each of the four described ports.

In a further optional example method, the processing circuit 275 may be configured to calculate a power for a port of the electric meter 150 by: multiplying a current of the first phase measured at the port by a measured line voltage for the first phase to determine a power of the first phase at the port; multiplying a current of the second phase measured at the port by a measured line voltage for the second phase to determine a power of the second phase at the port; and adding the power of the first phase to the power of the second phase.

In an example use case, the first controllable electrical disconnect switch 135 and/or the second controllable electrical disconnect switch 140 may be configured to remain open when the first voltage transducer 235 and the second voltage transducer 240 do not detect a substantial voltage from the electric distribution power source 110. Furthermore, the first controllable electrical disconnect switch 135 and/or the second controllable electrical disconnect switch 140 may be used to synchronize voltage phases from the first distributed energy resource device 115 and/or the second distributed energy resource device 120 respectively, with the electric distribution power source 110.

For example, the seventh and eighth voltage transducers 265 and 270 may measure a voltage supplied to the load 125 by the first distributed energy resource device 115 and/or the second distributed energy resource device 120, while the first and second voltage transducers 235 and 240 measure the voltage supplied by the electric distribution power source 110 and while the third controllable electrical disconnect switch 145 is open. Upon reaching synchronization between the first distributed energy resource device 115 and/or the second distributed energy resource device 120 and the electric distribution power source 110 during a synchronization operation, the third controllable electrical disconnect switch 145 may close. Furthermore, the third controllable electrical disconnect switch 145 may effectively disconnect the electric meter 150 from the electric distribution power source 110, e.g. the grid. The ability to disconnect the electric meter 150 from the electric distribution power source 110 may enable "islanding," which involves disconnecting the electric meter 150 from the electric distribution power source 110 and supplying power to the load 125 and/or one of the first distributed energy resource device 115 and/or the second distributed energy resource devices 120 from the other of the first distributed energy resource device 115 and/or the second distributed energy resource devices 120.

The first controllable electrical disconnect switch 135 may effectively connect or disconnect the first distributed energy resource device 115 with the electric meter 150. In connecting the first distributed energy resource device 115 with the electric meter 150, the electric meter 150 may measure power production or consumption of the first distributed energy resource device 115 as a separate value to the energy consumed from or sent back to the electric distribution power source 110. Consumption from the electric distribution power source 110 or production fed back to the electric distribution power source 110 may be metered. Furthermore, the first controllable electrical disconnect switch 135 may connect or disconnect the first distributed energy resource device 115 from the electric distribution power source 110 based on, for example, power production or consumption requirements of the electric distribution power source 110 and first distributed energy resource device 115.

The second controllable electrical disconnect switch 140 may effectively connect or disconnect the second distributed energy resource device 120 with the electric meter 150. In connecting the second distributed energy resource device 120 with the electric meter 150, the electric meter 150 may measure power production or consumption of the second distributed energy resource device 120 as a separate value to the energy consumed from or sent back to the electric distribution power source 110. Consumption from the electric distribution power source 110 or production fed back to the electric distribution power source 110 may be metered. Furthermore, the second controllable electrical disconnect switch 140 may connect or disconnect the second distributed energy resource device 120 from the electric distribution power source 110 based on, for example, power production or consumption requirements of the electric distribution power source 110 and second distributed energy resource device 120.

That is, the electric meter 150 may be configured measure and control the electricity delivered to the load 125 via any combination of the electric distribution power source 110, first distributed energy resource device 115 and the second distributed energy resource devices 120.

For purposes of example only, an electric meter socket 155 is also depicted. The electric meter socket 155 comprising a plurality of receptacles (not shown) configured to receive the electric meter 150, e.g. receive corresponding blades of the electric meter 150.

The electric meter socket 155 may be configured to couple the first set of conductive paths 105 to the first phase of the electric distribution power source 110, the first phase of the first distributed energy resource device 115, the first phase of the second distributed energy resource device 120, and the first phase of a load 125, depending upon a selected configuration of the plurality of controllable electrical disconnect switches 135, 140, 145.

Similarly, the electric meter socket 155 may be configured to couple the second set of conductive paths 130 to the second phase of the electric distribution power source 110, the second phase of the first distributed energy resource device 115, the second phase of the second distributed energy resource device 120, and the second phase of a load 125, depending upon a selected configuration of the plurality of controllable electrical disconnect switches 135, 140, 145.

Additionally, for purses of example only, the electric meter socket 155 comprises a neutral connection path 175 configured to form a neutral conductive path between the electric meter 150 and neutral conductors of the electric distribution power source 110, the first distributed energy resource device 115, the second distributed energy resource device 120, and the load 125. The neutral connection path may be known in the art as a 'ground'. The ability to perform first phase to neutral and second phase to neutral voltage measurements at the DER ports of the first and second distributed energy resource devices 115, 120, as well as performing current measurements, may enable effective implementation load disaggregation algorithms. Such load disaggregation algorithms may be executed, at least in part, by the processing circuit 275 and/or by another device, server, cloud based device or the like that the electric meter 150 may communicate with via the communications module 290.

Figure 2:
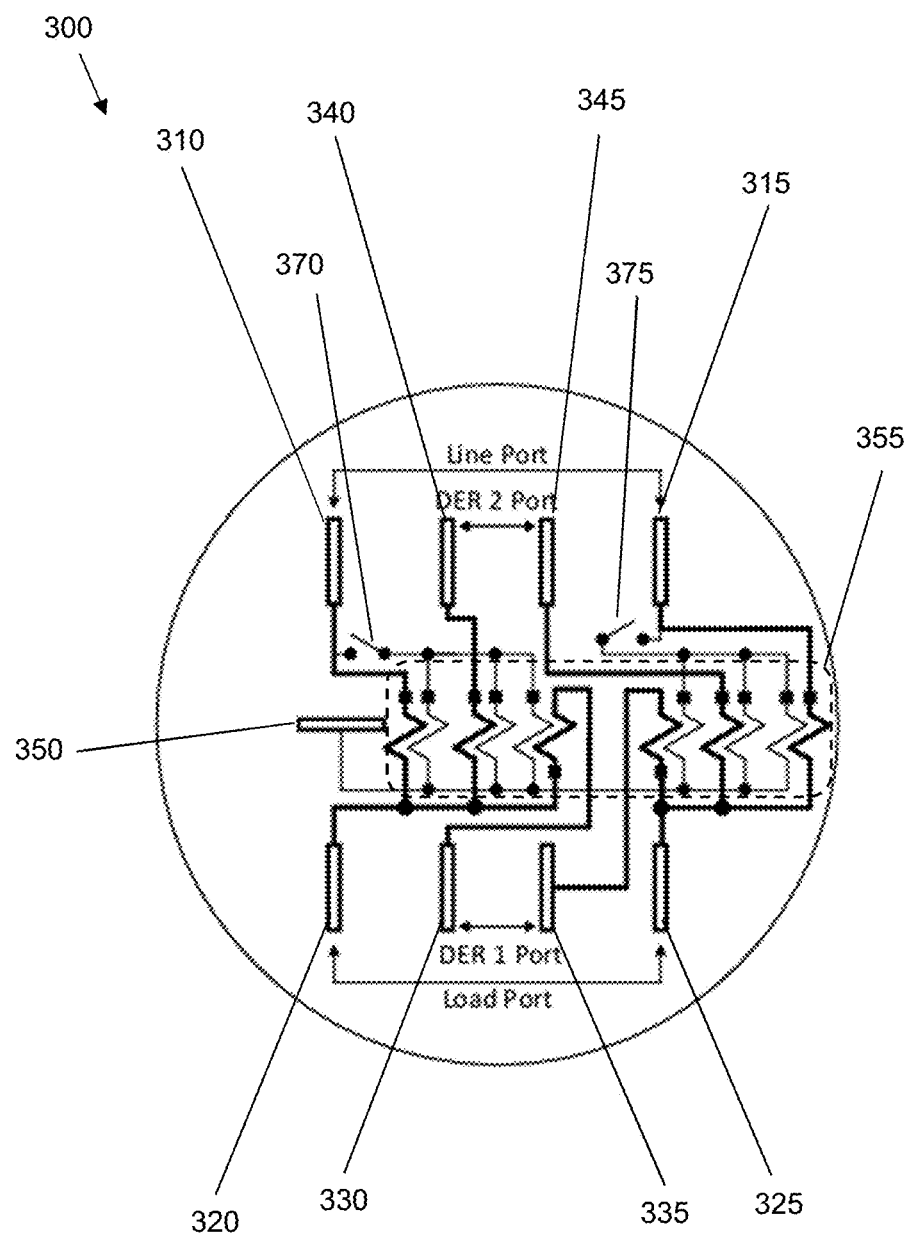
FIG. 2 depicts a representation of an electric meter, showing an arrangement of blades, according to an embodiment of the disclosure.

FIG. 2 depicts a representation of an electric meter 300, showing an arrangement of blades, according to an embodiment of the disclosure.

As described above, the electric meter 300 is an example of an electric meter comprising six current transducers and six voltage transducers. That is, in example embodiments optional transducers 180 depicted in the example embodiment of FIG. 1 are not implemented in the example embodiment of FIG. 2.

Each blade is a conductor configured to be received by a corresponding receptacle of the meter socket 155.

The plurality of blades are arranged to provide a line port, denoted "line port" in FIG. 2. The line port comprises a first blade 310 corresponding to a first phase of the electric distribution power source 110 and a second blade 315 corresponding to a second phase of the electric distribution power source 110.

The plurality of blades are arranged to provide a load port, denoted "load port" in FIG. 2. The load port comprises a third blade 320 corresponding to a first phase of the load 125 and a fourth blade 325 corresponding to a second phase of the load 125.

The plurality of blades are arranged to provide a first distributed energy resource port, denoted "DER 1 Port" in FIG. 2. The first distributed energy resource port comprises a fifth blade 330 corresponding to a first phase of the first distributed energy resource device 115 and a sixth blade 335 corresponding to a second phase of the first distributed energy resource device 115.

The plurality of blades are arranged to provide a second distributed energy resource port, denoted "DER 2 Port" in FIG. 2. The second distributed energy resource port comprises a seventh blade 340 corresponding to a first phase of the second distributed energy resource device 120 and an eighth blade 345 corresponding to a second phase of the second distributed energy resource device 120.

The plurality of blades comprise a ninth blade 350 for providing a neutral connection path.

In the example, fifth and sixth blades 330, 335 of the first distributed energy resource port are disposed between third and fourth blades 320, 325 of the load port. In the example, seventh and eighth blades 340, 345 of the second distributed energy resource port are disposed between first and second blades 310, 315 of the line port.

The ninth blade 350 of the neutral connection path is disposed substantially between the line port and the load port.

Although nine blades are disclosed, it will be understood that embodiments of electric meters 150 and meter sockets 155 according to the present disclosure may include more than or fewer than nine blades and corresponding receptacles respectively. For example, when only one voltage phase is connected fewer than nine blades and receptacles may be included, since blades and receptacles for additional phases are not needed. Similarly, when three voltage phases are connected additional blades and corresponding receptacles may be implemented.

Furthermore, it will be appreciated that the configuration of blades depicted in FIG. 2 is provided for purposes of example, and other configurations of blades fall within the scope of the disclosure. For example, a position of the eight blades (or nine if the optional neutral blade is implemented) relative to one another may be different from that of FIG. 2.

Also depicted are the metrology components 355, with voltage transducers depicted with a relatively thin line, and current transducers depicted with a relatively bold line. It can be seen that in the example electric meter 300, each phase of the line port, the DER 1 Port, and the DER 2 port comprises a corresponding voltage transducer and a corresponding current transducer, e.g. a total of six current transducers and six voltage transducers.

Also depicted is a circular profile 360 of the electric meter 300, which may correspond to a substantially cylindrical shape of a housing of the electric meter 300, e.g. a housing for the metrology components 355.

It will be understood that other form factors of housing may be implemented, such as form-factors having cross-section being rectangular, square, polygonal, or the like.

Also depicted is a first test link 370 and a second test link 375, also known in the art as "potential links" or even "pot links". Although depicted as opened switches, it will be understood by one of skill in the art that the test links 370, 275 are for purposes of testing, e.g. in the laboratory or during production for purposes of "phantom loading", and therefore said test links 370, 375 are typically closed in the field. Furthermore, it will be understood that, although only two test links 370, 375 are depicted, in other example embodiments more than two test links may be implemented.

Figure 3:
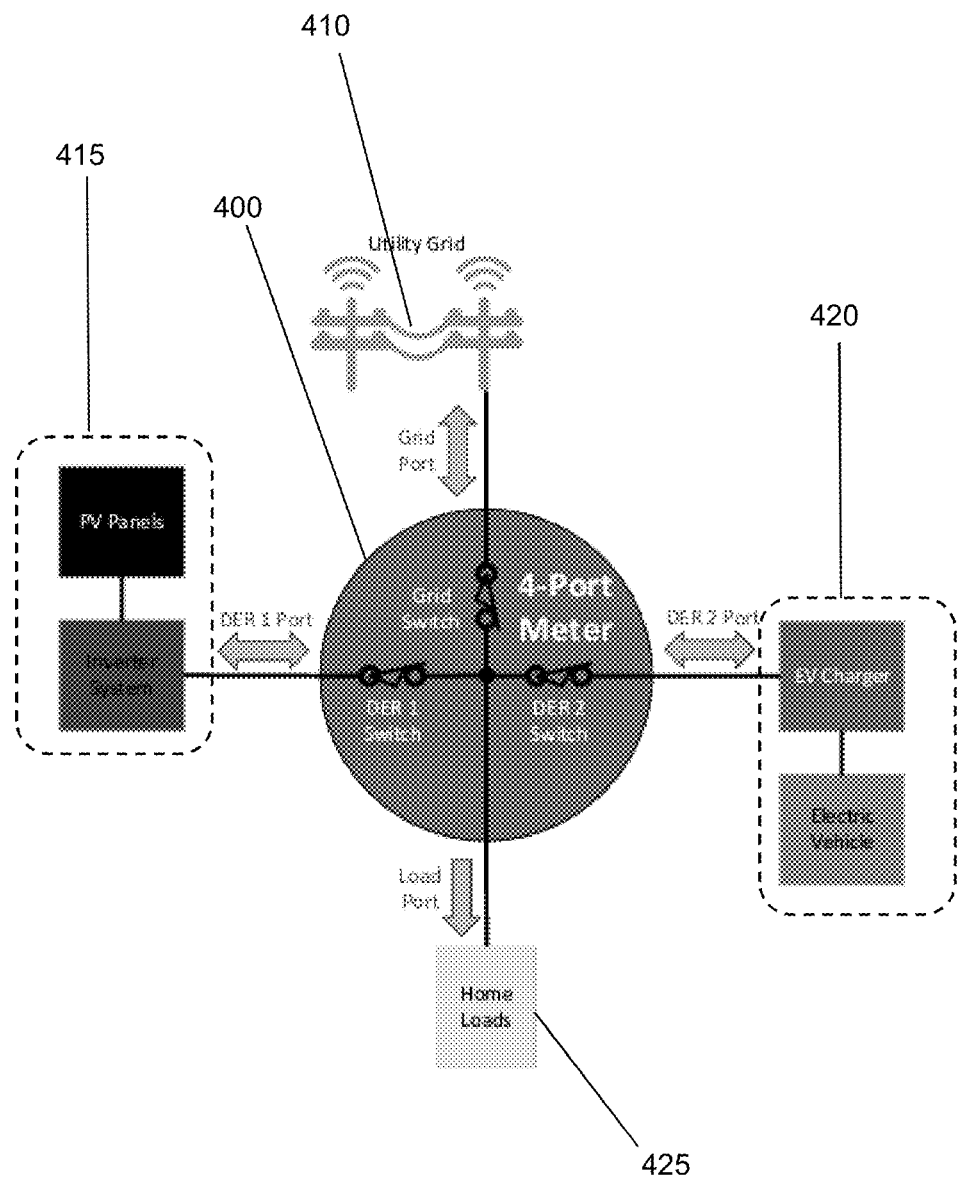
FIG. 3 depicts a representation of an example use-case of the electric meter of FIG. 1, according to an embodiment of the disclosure.

FIG. 3 depicts a representation of an example use-case of an electric meter 400, which may be the electric meter 150 of FIG. 1 or the electric meter 300 of FIG. 2, according to an embodiment of the disclosure. The electric meter 400 is denoted "4-port meter".

For purposes of example only, a first distributed energy resource 415 is an inverter system coupled to photovoltaic panels. That is, the first distributed energy resource 415 may operate as an energy generator. In some examples, the first distributed energy resource 415 may also operate as an energy consumer, as represented by the bidirectional arrow between the DER 1 Port and the first distributed energy resource 415. For example, local storage such as a battery system may be provided with the first distributed energy resource 415 and, in some instances, said local storage may receive electricity for charging, wherein the electricity is provided via another port of the electric meter 400.

For purposes of example only, a second distributed energy resource 420 is an Electric Vehicle (EV) charger coupled to an electric vehicle. That is, the second distributed energy resource 420 may operate primarily as an energy consumer, for charging a battery of the electric vehicle. In some examples, the second distributed energy resource 420 may also operate as an energy provider, as represented by the bidirectional arrow between the DER 2 Port and the second distributed energy resource 420. As a non-limiting example, the vehicle battery may provide electrical power to a premises at which the electric vehicle charger is installed, via the DER 2 Port, such as in an instance of a failure of the supply to the Grid Port.

Also depicted is a load 425 coupled to the Load Port. The load, which may in a non-limiting example comprise all home loads, which may comprise appliances that consume electrical power such as air conditioning or the like, is a consumer of electrical power, as denoted by the unidirectional arrow between the Load Port and the load 425.

Also depicted is an electric distribution power source 410, e.g. the grid, coupled to the Line Port. The electric distribution power source 410 may provide electrical energy, via the meter 400, to one or more other ports of the meter 400. The electric distribution power source 410 may also receive electrical energy, via the meter 400, from one or more other ports of the meter 400, as represented by the bidirectional arrow between the Line Port and the electric distribution power source 410.

As described above, the disclosed electric meter 150, 300, 400 enables metering and disaggregation of individual distributed energy resource device usage.

Furthermore, the above-described ability to disconnect the electric meter 150, 300, 400 from the electric distribution power source 110, 410 may enable "islanding," which involves disconnecting the electric meter 150, 300, 400 from the electric distribution power source 110, 410 and supplying power to the load 125, 425 and/or one of the first distributed energy resource device 115, 415 and/or the second distributed energy resource devices 120, 420 from the other of the first distributed energy resource device 115, 415 and/or the second distributed energy resource devices 120, 415.

In a first example usage, the meter 400 may be configured such that the first distributed energy resource 415, which may generate electricity from solar energy, is configured to provide this generated electricity to the second distributed energy resource 420, to charge the battery of the electric vehicle. Depending upon a configured and/or selected configuration of the meter, the electric distribution power source 410 may be effectively disconnected form the meter 400 by the controllable electrical disconnect switches, e.g. in an example of "islanding".

In a second example usage, the meter 400 may be configured such that any surplus electrical energy generated by the first distributed energy resource 415 that is not required by the second distributed energy resource 420, may instead be provided to the electric distribution power source 410 via the Grid Port.

In further examples of usage of the disclosed electric meter, a load control device may be coupled to one or both of the distributed energy resource ports. A s a non-limiting example, such a load control device may comprise any of: an electric vehicle charger; an HVAC system; a hot water heater; an air conditioner; a thermostat; a heat pump; a pool pump; a refrigerator; a dryer; a solar inverter; a battery system; or the like.

Although the disclosure has been described in terms of particular embodiments as set forth above, it should be understood that these embodiments are illustrative only and that the claims are not limited to those embodiments. Those skilled in the art will be able to make modifications and alternatives in view of the disclosure, which are contemplated as falling within the scope of the appended claims. Each feature disclosed or illustrated in the present specification may be incorporated in any embodiments, whether alone or in any appropriate combination with any other feature disclosed or illustrated herein.

LIST OF REFERENCE NUMERALS 100 electric meter
105 first set of conductive paths
110 electric distribution power source
115 first distributed energy resource device
120 second distributed energy resource device
125 load
130 second set of conductive paths
135 first controllable electrical disconnect switch
140 second controllable electrical disconnect switch
145 third controllable electrical disconnect switch
150 electric meter
180 optional transducers
190 communications module
205 first current transducer
210 second current transducer
215 third current transducer
220 fourth current transducer
225 seventh current transducer
230 eighth current transducer
235 first voltage transducer
240 second voltage transducer
245 third voltage transducer
250 fourth voltage transducer
255 fifth voltage transducer
260 sixth voltage transducer
265 seventh voltage transducer
270 eighth voltage transducer
275 processing circuit
280 fifth current transducer
285 acquisition circuit
290 communications module
295 sixth current transducer
300 electric meter
310 first blade
315 second blade
320 third blade
325 fourth blade
330 fifth blade
335 sixth blade
340 seventh blade
345 eighth blade
350 ninth blade
355 metrology components
370 first test link
375 second test link
400 electric meter
410 electric distribution power source
415 first distributed energy resource
420 second distributed energy resource
425 load

The invention claimed is:

1. An electric meter comprising:
   a first set of conductive paths configured to connect a first phase of an electric distribution power source, a first phase of a first distributed energy resource device, a first phase of a second distributed energy resource device, and a first phase of a load, and
   a second set of conductive paths configured to connect a second phase of the electric distribution power source, a second phase of the first distributed energy resource device, a second phase of the second distributed energy resource device, and a second phase of the load,
   the meter further comprising a plurality of blades, wherein the plurality of blades are arranged to provide at least:
      a line port comprising connectivity to the first and second phases of the electric distribution power source;
      a load port comprising connectivity to the first and second phases of the load;
      a first distributed energy resource port comprising connectivity to the first and second phases of the first distributed energy resource device; and
      a second distributed energy resource port comprising connectivity to the first and second phases of the second distributed energy resource device.

2. The electric meter of claim 1, wherein:
   blades of the first distributed energy resource port are disposed between blades of the load port; and
   blades of the second distributed energy resource port are disposed between blades of the line port; and optionally
   a blade of a neutral connection path is disposed substantially between the line port and the load port.

3. The electric meter of claim 1, comprising at least one of:
   a first controllable electrical disconnect switch configured to selectively connect the first distributed energy resource device to the electric distribution power source, the load and/or the second distributed energy resource device;
   a second controllable electrical disconnect switch configured to selectively connect the second distributed energy resource device to the electric distribution power source, the load and/or the first distributed energy resource device; and/or
   a third controllable electrical disconnect switch configured to selectively connect the electric distribution power source to the first distributed energy resource device, the load and/or the second distributed energy resource device.

4. The electric meter of claim 1, comprising:
   first electrical metrology components configured to meter one or more voltages and/or currents of the first set of conductive paths; and
   second electrical metrology components configured to meter one or more voltages and/or currents of the second set of conductive paths.

5. The electric meter of claim 4, comprising a housing configured to house at least the first and second electrical metrology components, optionally wherein the housing comprising a substantially cylindrical shape.

6. The electric meter of claim 4, wherein the first electrical metrology components comprise at least one of:
   a first set of current transducers configured to monitor a current on at least one of:
      the first phase of the electric distribution power source;
      the first phase of the first distributed energy resource device;
      the first phase of the second distributed energy resource device;
      the first phase of the load;
   and/or
   a first set of voltage transducers configured to monitor a voltage on at least one of:
      the first phase of the electric distribution power source;
      the first phase of the first distributed energy resource device;
      the first phase of the second distributed energy resource device;
      the first phase of the load.

7. The electric meter of claim 6, wherein the second electrical metrology components comprise: at least one of:
   a second set of current transducers configured to monitor a current on at least one of
      the second phase of the electric distribution power source;
      the second phase of the first distributed energy resource device;
      the second phase of the second distributed energy resource device;
      the second phase of the load;
   and/or
   a second set of voltage transducers configured to monitor a voltage on at least one of:
      the second phase of the electric distribution power source;
      the second phase of the first distributed energy resource device;
      the second phase of the second distributed energy resource device;
      the second phase of the load.

8. The electric meter of claim 4, further comprising a processing and acquisition circuit configured to acquire and process measurements from the first and second electrical metrology components.

9. The electric meter of claim 1, further comprising a communications module, wherein the communications module is configured to enable communication with other meters and/or with a utility.

10. A electric meter system, comprising:
    an electric meter according to claim 1; and
    an electric meter socket comprising a plurality of receptacles configured to receive the electric meter;
    wherein the electric meter socket is configured to couple: the first set of conductive paths to the first phase of the electric distribution power source, the first phase of the first distributed energy resource device, the first phase of the second distributed energy resource device, and the first phase of a load; and the second set of conductive paths to the second phase of the electric distribution power source, the second phase of the first distributed energy resource device, the second phase of the second distributed energy resource device, and the second phase of a load.

11. The system of claim 9, wherein the socket comprises at least one neutral connection path configured to form a neutral conductive path between the electric meter and neutral conductors of the electric distribution power source, the first distributed energy resource device, the second distributed energy resource device, and the load.

12. A method of use of the electric meter of claim 1, the method comprising coupling the meter, via a corresponding meter socket, to an electric distribution power source, a first distributed energy resource device, a second distributed energy resource device, and a load.

13. The method of claim 12, comprising a step of:
configuring a first controllable electrical disconnect switch of the meter to connect the first distributed energy resource device to the load and/or the second distributed energy resource device;
configuring a second controllable electrical connect switch of the meter to connect the second distributed energy resource device to the load and/or the first distributed energy resource device; and
configuring a third controllable electrical disconnect switch of the meter configured to disconnect the electric distribution power source from the first distributed energy resource device, the load and/or the second distributed energy resource device.

14. The method of claim 12, comprising calculating a power for a port of the electric meter by:
multiplying a current of the first phase measured at the port by a measured line voltage for the first phase to determine a power of the first phase at the port;
multiplying a current of the second phase measured at the port by a measured line voltage for the second phase to determine a power of the second phase at the port;
adding the power of the first phase to the power of the second phase.

* * * * *